United States Patent
Napolitano

(12) 
(10) Patent No.: US 6,589,816 B2
(45) Date of Patent: Jul. 8, 2003

(54) METHOD OF FORMING METAL CONNECTION ELEMENTS IN INTEGRATED CIRCUITS

(75) Inventor: Mario Napolitano, Vimercate (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 10/068,549

(22) Filed: Feb. 6, 2002

(65) Prior Publication Data

US 2002/0111015 A1 Aug. 15, 2002

(30) Foreign Application Priority Data

Feb. 7, 2001 (EP) .............................. 00830077

(51) Int. Cl.⁷ .............................. H01L 21/44
(52) U.S. Cl. ...................... 438/113; 637/460
(58) Field of Search ................. 438/460–465, 438/106–113, 678

(56) References Cited

U.S. PATENT DOCUMENTS

2002/0130394 A1 * 9/2002 Toyoda ..................... 257/618

FOREIGN PATENT DOCUMENTS

EP         0928016       7/1999      ......... H01L/21/301

OTHER PUBLICATIONS

Patent Abstracts of Japan, vol. 015, No. 454 (E–1137), Nov. 25, 1991 & JP 03198342 A (Nec Corp.), Aug. 29, 1991.

Patent Abstracts of Japan, vol. 017, No. 028 (E–1308), Jan. 19, 1993 & JP 04250628 A (Nippon Steel Corp.), Sep. 7, 1992.

* cited by examiner

*Primary Examiner*—David Nelms
*Assistant Examiner*—D Le
(74) *Attorney, Agent, or Firm*—Lisa K. Jorgenson; Allen, Dyer, Doppelt, Milbrath & Gilchrist, P.A.

(57) ABSTRACT

A method of forming metal connection elements in integrated circuits formed on adjacent areas of a wafer includes forming a conductive seed layer on a substrate of the wafer. A first mask covers the integrated circuits and leaves exposed areas of the seed layer overlying predetermined scribe lines used for separation of the integrated circuits. Using the seed layer as a cathode, a metal is deposited by an electrochemical process on exposed areas of the seed layer. The first mask is removed and a second mask is formed, leaving predetermined areas of the seed layer exposed. Using the seed layer as a cathode a metal is deposited on the exposed predetermined areas by an electrochemical process. The second mask is then removed. Connection elements of uniform thickness throughout the substrate are produced with the use of a very thin seed layer.

28 Claims, 3 Drawing Sheets

METHOD OF FORMING METAL CONNECTION ELEMENTS IN INTEGRATED CIRCUITS

FIELD OF THE INVENTION

The present invention relates to electronic and semiconductor devices, and more particularly, to a method of forming electrical connections in integrated circuits.

BACKGROUND OF THE INVENTION

Integrated circuits are formed on circular wafers of semiconductor material, which is typically monocrystalline silicon. Each wafer contains a large number of dies of the same device which, upon completion of the processing of the wafer, are separated to be mounted on suitable support structures and to be electrically connected to metal pins for connection to external circuits.

The final stages of the processing of the wafer includes the formation of a layer of dielectric material on the semiconductor substrate, and the formation of electrical connections between components of each integrated circuit. That is, the electrical connections are conductive elements for electrically connecting areas of the semiconductor substrate to other areas of the same substrate, or to areas of conductive layers formed thereon.

A known technique for forming electrical connection elements uses the deposition of a metal by electrochemical means. To initiate deposition of this type, it is necessary to deposit a conductive base layer (a seed layer) which enables an electrical connection to be established between the areas to be metallized and the negative electrode of the voltage supply used for the treatment. The seed layer must have low resistivity and a controlled thickness to ensure uniform current throughout the wafer during the electrochemical treatment, and must also adhere well to the dielectric layer which is normally an oxide and covers the wafer. The seed layer must also be compatible with the metal to be deposited.

Metals or alloys of metals which are no less noble than the metal to be used for the electrochemical deposition, that is, which do not react spontaneously with the electrolyte of the electrolytic bath, are used as the seed layer. Copper is often used for the seed layer, particularly if copper is also to be used for the connection elements. However, copper, like other metals that may be used for the seed layer, does not have good adhesion to the oxide and tends to diffuse into it. As is known, before the seed layer is formed, an intermediate layer of a metal which has a strong attraction for oxygen atoms and which at the same time ensures a good inter-metallic bond with the seed layer is therefore formed. The intermediate layer, also known as the barrier layer, also serves to prevent or at least reduce the diffusion of the metal of the seed layer into the underlying oxide layer.

A refractory metal or an alloy thereof, for example, Ta, TaNx, Cr, CrNx, Ti, TiNx, W, and WNx is deposited by sputtering or by chemical vapor deposition (CVD). This metal is usually selected for the barrier layer. As stated above, copper, which is deposited by sputtering or by electroless plating, is often selected for the seed layer.

The thickness necessary for the seed layer is determined on the basis of the dimensions of the wafer. For electrochemical treatment, the wafer, or more precisely, the seed layer which covers it, extends to the edges. The larger the wafer, the thicker the seed layer must therefore be to ensure good uniformity of the layer deposited, even in the central regions of the wafer.

With the tendency to use wafers of ever larger diameters, the need for a thicker seed layer is greater. However, a large thickness of the seed layer leads to problems since the removal of the seed layer after it has performed its function also entails the removal of metal from the connection elements which have just been formed. This reduces the width and thickness of the connection elements.

SUMMARY OF THE INVENTION

In view of the foregoing background, an object of the present invention is to provide a method of forming metal connection elements which uses electrochemical deposition, which does not require very thick seed layers, and which ensures optimal uniformity of thickness of the connection elements.

These and other objects, advantages and features according to the present invention are provided by a method for forming metal connection elements in a plurality of integrated circuits on a wafer. The method comprises forming a seed layer on the wafer, and forming a first mask on the seed layer covering the plurality of integrated circuits while exposing first portions of the seed layer overlying scribe lines used for separating the integrated circuits. Conductive strips are formed on the first portions of the seed layer.

The method further comprises removing the first mask, and forming a second mask on the conductive strips while exposing second portions of the seed layer. Metal connection elements are formed on the second portions of the seed layer by electrochemical deposition using the seed layer as a cathode.

BRIEF DESCRIPTION OF THE DRAWINGS

The invention will be better understood from the detailed description of a non-limiting embodiment thereof given with reference to the appended drawings, in which.

DETAILED DESCRIPTION OF THE PREFERRED EMBODIMENTS

Figure 1:
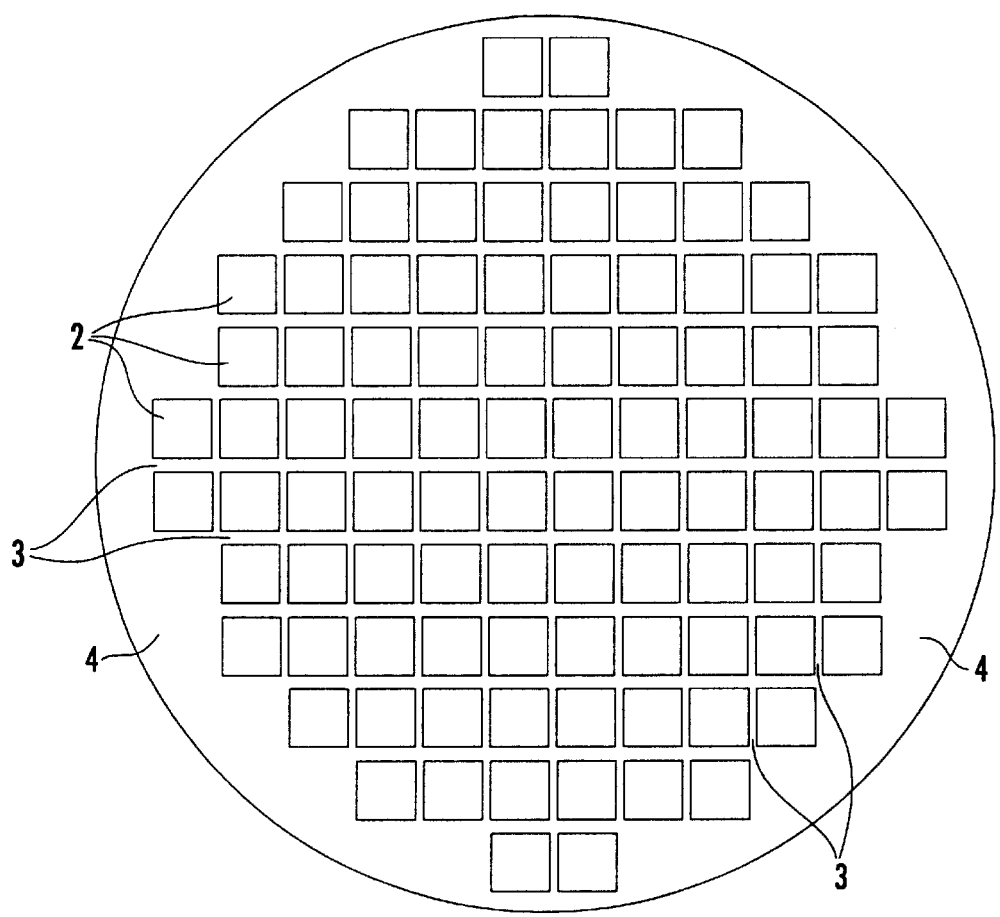
FIG. 1 illustrates a wafer of semiconductor material prior to being processed according to the present invention.

Referring initially to FIG. 1, upon completion of the production process, a wafer of semiconductor material comprises a plurality of integrated circuits 2 separated by channels 3. The channels 3 intersect at right angles to define scribe lines for cutting (mechanically or by laser) so that the wafer can be subdivided into separate chips.

The wafer is formed by a substrate 10 of semiconductor material, for example, monocrystalline silicon, and is processed in the usual manner up to the formation of a layer 11 of dielectric material, for example, silicon dioxide. Vias extend through the dielectric layer 11 and are filled by electrical connection elements or plugs 12. The electrical connection elements or plugs 12 are formed, for example, of tungsten, and are in contact with the semiconductor surface 10 on areas which are to be connected to other areas of the same surface, or to areas of conductive elements within or external the integrated circuit. The following steps form electrical connections according to the method of the invention.

Figure 2:
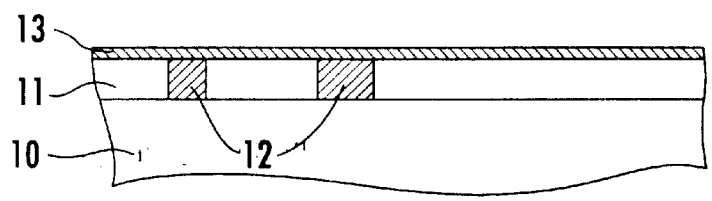
FIGS. 2 to 12 are cross sectional views of greatly enlarged portions of an integrated circuit in a wafer of semiconductor material at successive processing stages according to the present invention.

A barrier layer, for example, TiN with a thickness between 50 and 500 nm, is formed on the dielectric layer 11 by sputtering. A seed layer, for example, copper with a thickness between 30 and 50 nm, is formed thereon by sputtering or electroless deposition. For simplicity of illustration, the barrier layer and the seed layer are shown in the drawings as a single layer 13, (FIG. 2) which will be referred to as the adhesion and seed layer.

Figure 3:
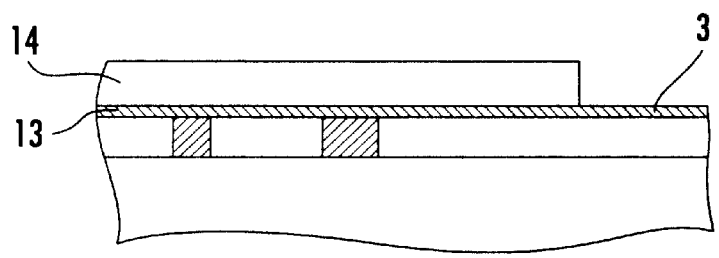

A photoresist mask 14 (FIG. 3) is formed on the layer 13 by usual photolithographic techniques and covers all of the areas occupied by the integrated circuits. The mask 14 leaves exposed only the areas overlying the channels 3 which define the scribe lines, and a peripheral area of the substrate 4 (FIG. 1), which is not occupied by entire integrated circuits.

A metal is deposited on the areas overlying the channels 3. For example, aluminum is deposited by one of the usual metallization techniques, or copper is deposited by an electrochemical process. If the latter deposition method is selected, which may be the most advantageous in this embodiment of the invention, the wafer is placed in a galvanic cell. The adhesion and seed layer 13 forms the cathode of the cell. When the cell is polarized, copper is deposited on the exposed areas of the seed layer 13, forming a grid of conductive strips 15 on the areas which overlie the scribe lines and a conductive element 5 on the peripheral area 4 (FIG. 13).

Figure 13:
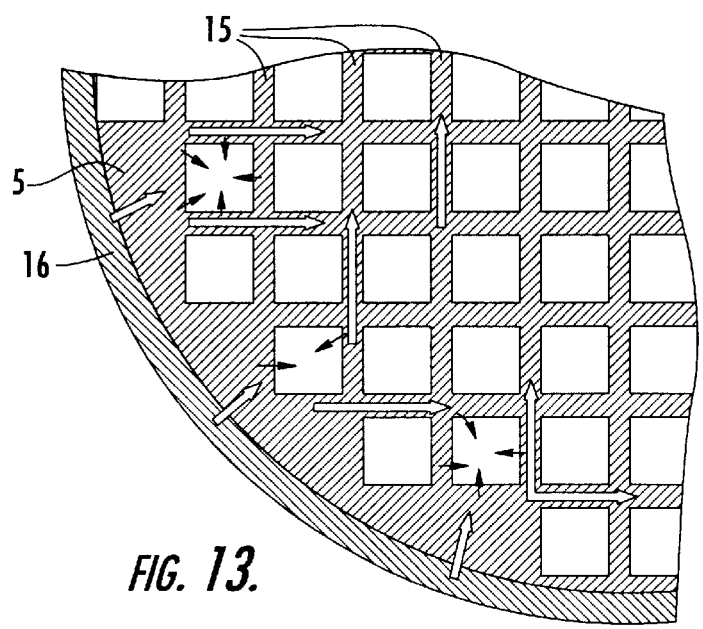
FIG. 13 illustrates an enlarged portion of the wafer illustrated in FIG. 1 at one of the processing stages according to the present invention.
Figure 4:
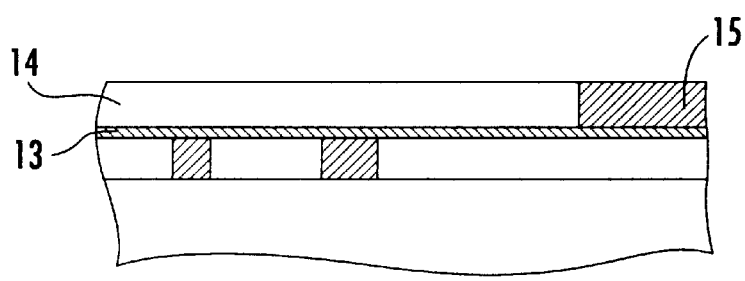
Figure 5:
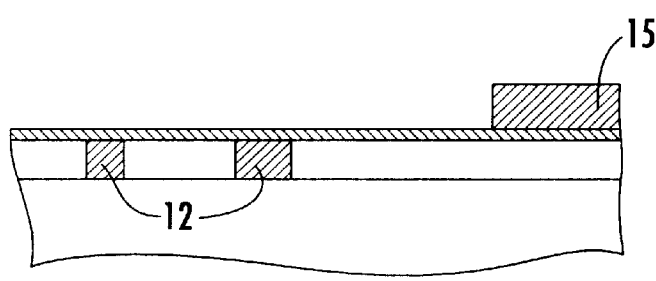

FIG. 13 also shows an annular rim 16 which represents the area of contact with the negative terminal of the voltage supply for polarizing the cell. The electrochemical deposition is interrupted when the thickness of the copper deposited has reached the thickness of the photoresist, for example, 300 nm (FIG. 4). The photoresist mask 13 is then removed (FIG. 5).

Figure 6:
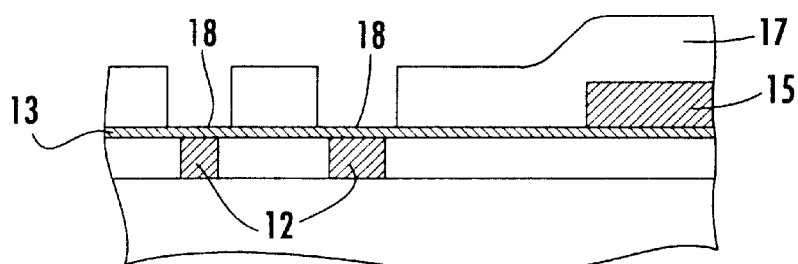
Figure 7:
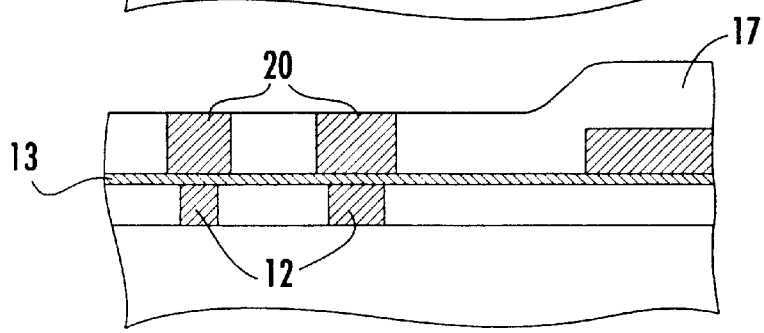

A case in which the connection elements or plugs 12 are to be connected electrically at a higher interconnection level will now be considered. For this purpose, a second photoresist mask 17 (FIG. 6) is formed and covers the seed layer 13 and the conductive strips 15, leaving exposed only areas 18 overlying the plugs 12 and the contact rim 16. The wafer is then subjected to a second electrochemical treatment with the use of the seed layer 13 as the cathode. Copper is deposited on the areas 18 and forms conductive elements 20 over the plugs 12 (FIG. 7). The paths of the current during the deposition process are shown schematically in FIG. 13.

Figure 8:
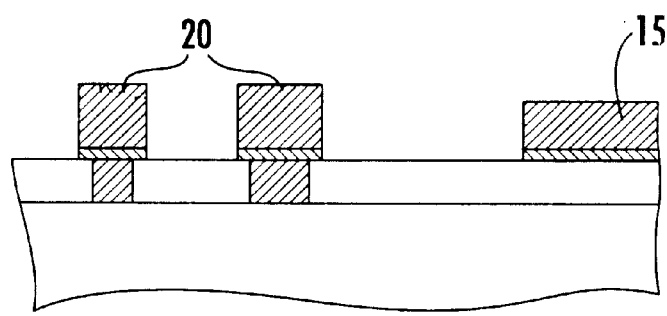
Figure 9:
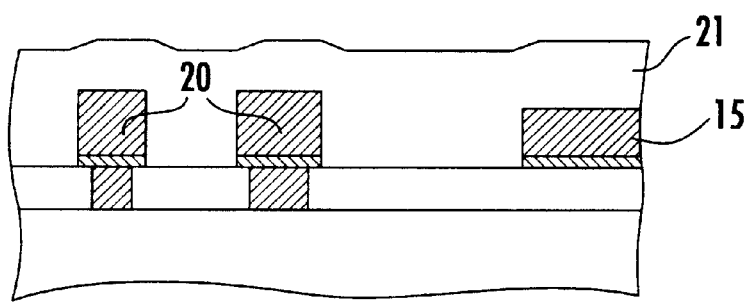
Figure 10:
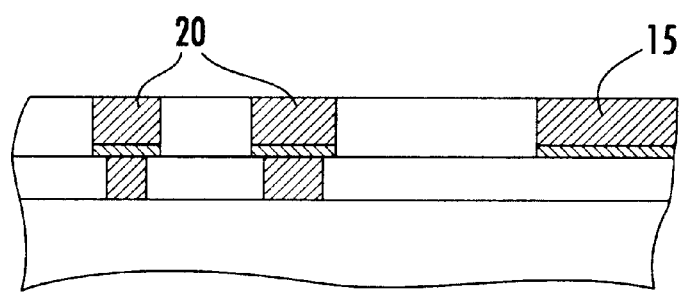

After the removal of the photoresist 17, the underlying seed layer 13 is removed (FIG. 8), for example, by reversal of the polarization of the electrolytic cell to remove the upper copper layer and then by isotropic etching to remove the TiN layer. A dielectric layer 21, for example, of silicon dioxide, is then formed by chemical vapor deposition (CVD), with a thickness that covers the conductive elements 20 and 15 (FIG. 9). The wafer is then subjected to chemical-mechanical polishing (or CMP) to level the dielectric layer 21 and to expose the conductive elements 20 and 15 (FIG. 10).

Figure 11:
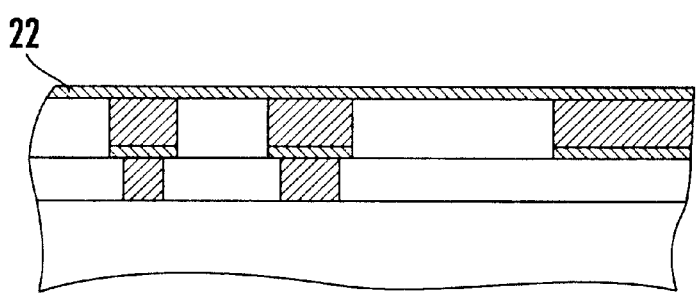
Figure 12:
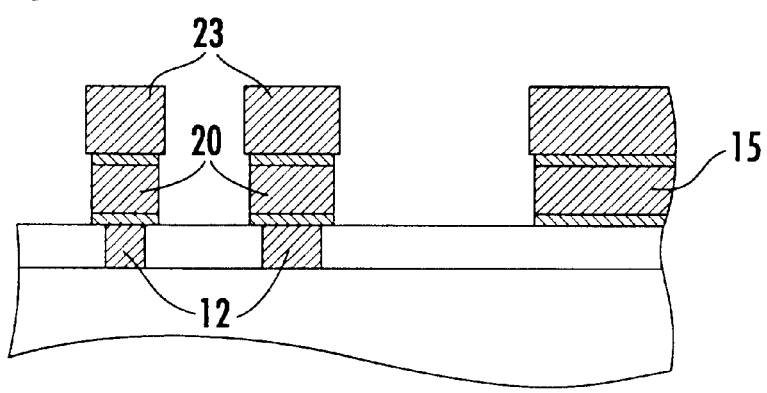

At this point, a further adhesion and seed layer 22 similar to the layer 13, as illustrated in FIG. 11, is formed. The steps described above with reference to FIGS. 6 to 10 are repeated to produce a structure such as that shown in FIG. 12 in which metal elements 23 of the second level form the desired interconnection elements. The treatment may be repeated a number of times equal to the number of interconnection levels required.

Upon completion of the process, the metal which covers the channels of the scribe lines is preferably removed to facilitate the cutting of the wafer. It is clear from the foregoing description that the method according to the invention achieves considerable advantages over known methods.

More particularly, it should be noted that, during the electrodeposition steps, the path of the current is formed mainly by the conductive elements of the grid formed on the scribe lines. Since these conductive elements are relatively wide, and are made of a good electrical conductor, and extend over the entire wafer, the uniformity of deposition is very good. Moreover, since the seed layer can be very thin, the etching necessary to remove it after it has performed its function does not cause significant reductions in the width and the thickness of the metal connection elements.

Although only one embodiment of the invention has been described and illustrated, clearly many variations and modifications are possible within the scope of the same inventive concept. For example, as already mentioned, the grid of conductive strips 15 may be formed by a metal other than that used for the connection elements 20, and may be formed by a deposition process other than the electrochemical process described.

That which is claimed is:

1. A method of forming metal connection elements in a plurality of integrated circuits on a wafer, the method comprising:
    forming a seed layer on the wafer;
    forming a first mask on the seed layer covering the plurality of integrated circuits while exposing first portions of the seed layer overlying scribe lines used for separating the integrated circuits;
    forming conductive strips on the first portions of the seed layer;
    removing the first mask;
    forming a second mask on the conductive strips while exposing second portions of the seed layer; and
    forming metal connection elements on the second portions of the seed layer by electrochemical deposition using the seed layer as a cathode.

2. A method according to claim 1, further comprising:
    removing the second mask leaving exposed third portions of the seed layer; and
    removing the third portions of the seed layer.

3. A method according to claim 1, further comprising forming a first dielectric layer on the wafer before forming the seed layer.

4. A method according to claim 3, further comprising forming a barrier layer on the first dielectric layer before forming the seed layer.

5. A method according to claim 4, wherein the barrier layer comprises a conductive material having an attraction for oxygen and a low diffusion coefficient for the metal used in the electrochemical deposition.

6. A method according to claim 3, wherein the first dielectric layer comprises oxide.

7. A method according to claim 3, further comprising:
    forming a second dielectric layer on the metal connection elements, on the conductive strips, and on the first dielectric layer; and
    planarizing a surface of the second dielectric layer for exposing the metal connection elements and the conductive strips.

8. A method according to claim 7, further comprising:
    forming a second seed layer on the second dielectric layer, on the metal connection elements and on the conductive strips;

forming a third mask on the second seed layer overlying the plurality of integrated circuits while exposing first portions of the second seed layer overlying the conductive strips;

forming second conductive strips on the first portions of the second seed layer;

removing the third mask;

forming a fourth mask on the second conductive strips while exposing second portions of the second seed layer; and forming metal connection elements on the second portions of the second seed layer by electrochemical deposition using the second seed layer as a cathode.

9. A method according to claim 1, wherein forming the conductive strips is performed using an electrochemical deposition that uses the seed layer as a cathode.

10. A method according to claim 1, wherein the conductive strips comprise a first metal, and the metal connection elements comprise a second metal different from the first metal.

11. A method according to claim 1, wherein the wafer comprises a contact rim along outer edges thereof so that the electrochemical deposition uses the contact rim as an anode.

12. A method according to claim 1, further comprising removing the conductive strips before separating the integrated circuits.

13. A method of forming metal connection elements in a plurality of integrated circuits on a wafer, the method comprising:

forming a dielectric layer on the water;

forming a seed layer on the dielectric layer;

forming a first mask on the seed layer covering the plurality of integrated circuits while exposing first portions of the seed layer overlying scribe lines used for separating the integrated circuits;

forming conductive strips on the first portions of the seed layer by electrochemical deposition using the seed layer as a cathode;

removing the first mask;

forming a second mask on the conductive strips while exposing second portions of the seed layer; and forming metal connection elements on the second portions of the seed layer by electrochemical deposition using the seed layer as a cathode.

14. A method according to claim 13, further comprising:

removing the second mask leaving exposed third portions of the seed layer; and removing the third portions of the seed layer.

15. A method according to claim 13, further comprising forming a barrier layer on the first dielectric layer before forming the seed layer.

16. A method according to claim 15, further comprising:

forming a second dielectric layer on the metal connection elements, on the conductive strips, and on the first dielectric layer; and planarizing a surface of the second dielectric layer for exposing the metal connection elements and the conductive strips.

17. A method according to claim 16, further comprising:

forming a second seed layer on the second dielectric layer, on the metal connection elements and on the conductive strips;

forming a third mask on the second seed layer overlying the plurality of integrated circuits while exposing first portions of the second seed layer overlying the conductive strips;

forming second conductive strips on the first portions of the second seed layer;

removing the third mask;

forming a fourth mask on the second conductive strips while exposing second portions of the second seed layer; and forming metal connection elements on the second portions of the second seed layer by electrochemical deposition using the second seed layer as a cathode.

18. A method according to claim 13, wherein the conductive strips comprise a first metal, and the metal connection elements comprise a second metal different from the first metal.

19. A method according to claim 13, wherein the wafer comprises a contact rim along outer edges thereof so that the electrochemical deposition uses the contact rim as an anode.

20. A method according to claim 13, further comprising removing the conductive strips before separating the integrated circuits.

21. A method of forming metal connection elements in a plurality of integrated circuits on a wafer, the method comprising:

forming a seed layer on the wafer;

forming a first mask on the seed layer covering the plurality of integrated circuits while exposing first portions of the seed layer overlying scribe lines used for separating the integrated circuits;

forming a contact rim along outer edges of the wafer;

placing the wafer in a galvanic cell;

forming conductive strips on the first portions of the seed layer by electrochemical deposition using the seed layer as a cathode and using the contact rim as an anode;

removing the wafer from the galvanic cell;

removing the first mask;

forming a second mask on the conductive strips while exposing second portions of the seed layer;

placing the wafer in the galvanic cell; and forming metal connection elements on the second portions of the seed layer by electrochemical deposition using the seed layer as the cathode and using the contact rim as the anode.

22. A method according to claim 21, further comprising:

removing the second mask leaving exposed third portions of the seed layer; and removing the third portions of the seed layer.

23. A method according to claim 21, further comprising forming a first dielectric layer on the wafer before forming the seed layer.

24. A method according to claim 23, further comprising forming a barrier layer on the first dielectric layer before forming the seed layer.

25. A method according to claim 23, further comprising:

forming a second dielectric layer on the metal connection elements, on the conductive strips, and on the first dielectric layer; and planarizing a surface of the second dielectric layer for exposing the metal connection elements and the conductive strips.

26. A method according to claim 25, further comprising:

forming a second seed layer on the second dielectric layer, on the metal connection elements and on the conductive strips;

forming a third mask on the second seed layer overlying the plurality of integrated circuits while exposing first portions of the second seed layer overlying the conductive strips;

placing the wafer in a galvanic cell;

forming conductive strips on the first portions of the second seed layer by electrochemical deposition using the second seed layer as a cathode and using the contact rim as an anode;

removing the wafer from the galvanic cell;

removing the third mask;

forming a fourth mask on the second conductive strips while exposing second portions of the second seed layer;

placing the wafer in the galvanic cell; and forming second metal connection elements on the second portions of the second seed layer by electrochemical deposition using the second seed layer as the cathode and using the contact rim as the anode.

27. A method according to claim 21, wherein the conductive strips comprise a first metal, and the metal connection elements comprise a second metal different from the first metal.

28. A method according to claim 21, further comprising removing the conductive strips before separating the integrated circuits.

* * * * *

UNITED STATES PATENT AND TRADEMARK OFFICE
CERTIFICATE OF CORRECTION

PATENT NO.    : 6,589,816 B2                                    Page 1 of 1
DATED         : July 8, 2003
INVENTOR(S)   : Napolitano It is certified that error appears in the above-identified patent and that said Letters Patent is hereby corrected as shown below:

<u>Title page,</u>
Item [30], delete "00830077" insert -- 01830077.2 --

Signed and Sealed this

Twenty-fifth Day of November, 2003

JAMES E. ROGAN
*Director of the United States Patent and Trademark Office*